United States Patent
Milliren et al.

(10) Patent No.: US 7,310,024 B2
(45) Date of Patent: Dec. 18, 2007

(54) HIGH STABILITY DOUBLE OVEN CRYSTAL OSCILLATOR

(76) Inventors: Bryan T. Milliren, 21 High Rd., Newbury, MA (US) 01951; Roger L. Clark, 7 Wilson Rd., Windham, NH (US) 03087

( * ) Notice: Subject to any disclaimer, the term of this patent is extended or adjusted under 35 U.S.C. 154(b) by 118 days.

(21) Appl. No.: 11/362,649

(22) Filed: Feb. 25, 2006

(65) Prior Publication Data

US 2006/0192626 A1    Aug. 31, 2006

Related U.S. Application Data

(60) Provisional application No. 60/656,825, filed on Feb. 28, 2005.

(51) Int. Cl.
*H03B 5/32* (2006.01)
*H03B 1/00* (2006.01)

(52) U.S. Cl. .................. 331/69; 331/176; 331/158

(58) Field of Classification Search ............ 331/65–69, 331/176, 158, 116 R
See application file for complete search history.

(56) References Cited

U.S. PATENT DOCUMENTS

| | | | |
|---|---|---|---|
| 5,719,782 A * | 2/1998 | Mitsuoka | 702/75 |
| 6,166,608 A * | 12/2000 | Merriss et al. | 331/69 |
| 6,236,282 B1 * | 5/2001 | Ballantyne et al. | 331/158 |
| 6,621,361 B1 * | 9/2003 | Fry | 331/69 |
| 6,731,180 B1 * | 5/2004 | Clark et al. | 331/176 |
| 6,784,756 B2 * | 8/2004 | Villella | 331/176 |
| 6,859,110 B2 * | 2/2005 | Satoh | 331/69 |
| 7,015,762 B1 * | 3/2006 | Nicholls et al. | 331/10 |
| 7,173,499 B2 * | 2/2007 | Satoh | 331/158 |

* cited by examiner

*Primary Examiner*—Joseph Chang
(74) *Attorney, Agent, or Firm*—Joseph E. Funk

(57) ABSTRACT

A double oven crystal oscillator (DOCXO) is disclosed which is highly stable by incorporating means to reduce the effects of ambient pressure changes on the frequency of the oscillator. The oscillator crystal is mounted in a temperature controlled inner oven to reduce the effects on the frequency stability of the oscillator. The oscillator circuitry and all circuitry associated with the inner oven is mounted in good thermal contact with the inner oven. A Faraday shield at ground potential is placed over the oscillator circuitry to minimize the effects of stray capacitance between the oscillator components and the case wall of the inner oven. The effects of minor deformations in the case walls within the oscillator caused by ambient pressure changes and other factors causing pressure changes are thereby greatly minimized. To further reduce effects on oscillator frequency stability the ovens of the DOCXO are temperature controlled, cases are hermetically sealed, the case walls are rigid, and ovens and cases may be evacuated.

20 Claims, 2 Drawing Sheets

HIGH STABILITY DOUBLE OVEN CRYSTAL OSCILLATOR

PRIORITY APPLICATION

This application is a utility patent application claiming priority under a prior U.S. provisional application Ser. No. 60/656,825, filed 28 Feb. 2005, and entitled "Highly Stabilized Ovenized Oscillator With Reduced Frequency Instabilities".

FIELD OF THE INVENTION

The invention relates generally to oscillators, particularly to oven-controlled or "ovenized" quartz crystal oscillators, and more particularly to double oven controlled crystal oscillators (DOCXO).

BACKGROUND OF THE INVENTION

Oscillators are used to generate frequencies for applications varying from relatively unsophisticated applications for wristwatches and the like, to such extremely sophisticated applications as timing systems for space navigational systems. Most commonly, quartz crystal resonators are used in oscillators, although certain highly accurate frequency standards can be configured using an atomic reference source, such as cesium or rubidium. However, the output frequency of a crystal oscillator varies with temperature and so these oscillators must operate in a temperature controlled environment in order to achieve high frequency stability. A common technique used to control the ambient temperature of a crystal oscillator is to put the crystal in a temperature controlled oven.

One approach that has been used to achieve higher frequency stability than the oven controlled crystal oscillator is the double oven controlled crystal oscillator (DOCXO). DOCXOs are similar in design to oven controlled crystal oscillators, with an additional outer oven wrapped around an internal oven controlled crystal oscillator. The outer oven means that DOCXOs have an additional layer of insulation over which the power input must balance the heat dissipation, resulting in another drop in maximum ambient temperature at which the oven will operate. Most DOCXOs use higher temperature set points, which increases aging, and compensate for this by using 3rd or 5th overtone crystals. This can cause a DOCXO to be bigger and require more power to operate.

Oven controlled crystal oscillators (OCXO) that are both stable and accurate, are highly desirable for use in many applications. A typical oven controlled crystal oscillator (OCXO) consists of a crystal based oscillator, a temperature control system, and support circuitry surrounded by a layer of thermal insulation enclosed in a sealed metal can. Inside the oven, the crystal is kept at a fixed temperature between 70 degrees Centigrade to 90 degrees Centigrade, based on the turnover point of the crystal where the frequency vs. temperature response is nominally flat. For example, an ovenized quartz crystal oscillator has means for controlling the temperature of a quartz crystal to an accuracy of less than 800 millidegrees centigrade. Currently, for example, stable and accurate OCXOs are sought for use in the design of base stations for cellular, PCS (personal communication system), and wireless local loop (WLL) systems that connect subscribers to a public switched telephone network. OCXOs can be used successfully, for instance, in the transmit and receive functions or in the clocks of CDMA (Code Division Multiple Access) base stations. The time error of a CDMA base station must be held to within 8.4 microseconds. This requirement forces an accuracy on the base station clock of a few milliHz for a 10 MHz signal which is difficult with an OXCO unless it is complex, relatively large and expensive.

In an OCXO, the crystal and associated components, the latter of which might also be sensitive to temperature, are enclosed in an oven that is kept at a stable temperature. Most temperature control systems are based on a thermistor/eror amplifier/semiconductor heater design. In order to maintain a constant temperature within the oven, there must be a balance of power input to the oven with heat flowing out of the oven. The temperature is kept constant by adjusting the amount of power supplied to the oven whenever the ambient temperature in the oven begins to change. The oven temperature selected is one at which the slope of the frequency vs. temperature curve for the crystal is zero. Thus, the oven minimizes the degree to which the frequency of the oscillator will vary with variations in temperature.

The realization of an OCXO typically requires: (1) a quartz crystal resonator as a primary reference element; (2) associated circuitry for frequency generation or synthesis; (3) a frequency tuning element or elements; (4) a thermal control system for the oven; and (5) an output buffer amplifier so that the signal output of the OCXO can be utilized.

More particularly, a typical oven controlled crystal oscillator (OCXO) consists of a crystal based oscillator and temperature control system and support circuitry surrounded by a layer of thermal insulation enclosed in a sealed metal can. Inside, the crystal is typically kept at a fixed temperature between 70 degrees centigrade and 90 degrees centigrade, based on the turnover point of the crystal where the frequency vs. temperature response is nominally flat.

Ovenized oscillators heat the temperature sensitive portions of the oscillator which is isolated from the ambient to a uniform temperature to obtain a more stable output. Ovenized oscillators contain a heater, a temperature sensor and circuitry to control the heater. The temperature control circuitry holds the crystal and critical circuitry at a precise, constant temperature. The best controllers are proportional, providing a steady heating current which changes with the ambient temperature to hold the oven at a precise set-point, usually about 10 degrees above the highest expected ambient temperature. Temperature induced frequency variations can be greatly reduced by an amount approaching the thermal gain of the oven. The crystal for the oven is selected to have a "turning-point" at or near the oven temperature further reducing the sensitivity to temperature. The combination of the high oven gain with operation near turning point yields temperature stabilities as good as 1.0 ppb (one part per billion) over a temperature range that would cause the crystal to change by 10 ppm (one part per million). Highly polished, high-Q crystals which often have significant activity dips may be designed with no activity dips near the operating temperature providing better stability and phase noise than crystals designed for wide temperature ranges. Ovenized oscillators allow the use of SC-cut crystals which offer superior characteristics but which are impractical for ordinary TCXOs because of their steep frequency drop at cooler temperatures. Unfortunately SC cut crystals are much more expensive to produce than AT cut crystals typically used in TCXO's. Oven oscillators have a higher power consumption than temperature compensated oscillators. Oven oscillators require a few minutes to warm-up and the power consumption is typically one or two watts at room temperature.

In order to achieve an OCXO with a desired accuracy and stability, the precision of the reference element has always been of great significance. Unfortunately, the requirement for a precise reference element has limited the yield of crystal production and has kept the cost of creating OCXOs high. This is because the precision of the frequency of a crystal is affected by a great number of factors in the manufacturing process, such as the thickness of the cut of the crystal wafer, the angle of the cut, and imperfections or scratches on the crystal. The oscillator circuitry sensitivity to the frequency of the reference element likewise has contributed to manufacturing obstacles to large-scale and cost-effective OCXO production. Typical frequency-tuning components, such as inductors, capacitors and varactor diodes, are sensitive to environmental conditions, such as temperature, and repeatability and tolerance drift of these components over time must be taken into account in a typical OCXO design. The thermal control system for the oven has to be capable of achieving very accurate temperature settings uniquely adjusted for the characteristics of the particular reference element used.

When greater frequency stability is desired than can be provided by an OXCO other frequency stabilization approaches are used. One approach that has been used to achieve even higher frequency stability than the OCXO is the double oven controlled crystal oscillator (DOCXO). DOCXOs are similar in design to the OCXO, with an additional outer oven wrapped around the internal OCXO. That is, a temperature controlled oven contained within another temperature controlled oven is utilized. The outer oven means that DOCXOs have an additional layer of insulation over which the power input must balance the heat dissipation, resulting in another drop in maximum ambient temperature at which the oven will operate. Most DOCXOs use higher temperature set points, which increases aging, and compensate for this by using 3rd or 5th overtone crystals. This can cause a DOCXO to be bigger and require more power to operate.

More particularly, in a double oven configuration two insulated enclosures are utilized, one being placed inside the other with a proportionally controlled heater assembly for each. In order to maintain temperature control of the assembly under varying ambient conditions, it is necessary to maintain a differential of about 10 degrees Celsius between the highest ambient temperature to be experienced and the set point of the outer oven. Another 10 degrees Celsius differential is then required between the outer oven and the inner oven. The total heat rise above ambient between the crystal and the outside of the outer oven is more than 20 degrees Celsius. If the ambient temperature is high, the inner oven may need to operate at temperatures of around 110 degrees Celsius. There are several significant disadvantages of operating an oscillator at this high of a temperature. First, the reliability of electronic components decreases with temperature. The mean time between failures (MTBF) or operating lifetime of the circuit assembly is reduced as the temperature increases. In order to improve the failure rate, higher grade components must be used or more time spent screening components. Second, aging of the crystal resonator is accelerated. Crystals age more rapidly at higher temperatures. As the crystal ages, its frequency shifts causing frequency stability to rapidly degrade.

In addition, while present DOCXOs provide a relatively stable frequency output, as technology has advanced the need for oscillators having greater and greater stability has grown. Thus, there is a need in the art for ovenized crystal oscillators that provide even greater frequency stability than typically available in the prior art which is typically less than 0.1 part ppb.

SUMMARY OF THE INVENTION

The present invention meets the need of the prior art for a highly stable, ovenized crystal oscillator 10 that provides stability much better than a milliHz for a 10 MHz signal.

The invention resides not in any one of the individual elements and features of a novel DOCXO disclosed herein per se, but rather in the particular combination of all of them and their physical orientation with respect to each other as disclosed and claimed herein. Those skilled in the art will appreciate that the novel idea upon which this disclosure is based may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

The novel double oven controlled crystal oscillator (DOCXO) 10 of the present invention has an oscillator crystal 17 mounted inside its own temperature controlled inner oven 15. Oven 15 with crystal 17 is in close thermal contact with temperature sensor 20, an oscillator circuit 16, a Faraday shield 21 and a control circuit 19 located inside an outer oven 11. The crystal 17 and heater 18 of inner oven 15 are mounted on a circuit board 16a along with associated circuitry comprising oscillator circuit 16. Control circuit 19 is responsive to information from temperature sensor 20 to control the temperature of inner oven 15 and the frequency of oscillation output from oscillator circuit 16 based on information previously stored in control circuit 19.

Inner oven 15 with oscillator crystal 17 and its associated circuitry described in the previous paragraph are all mounted inside an insulated, evacuated, hermetically sealed, temperature controlled outer oven 11. Outer oven 11 has a heater 12, temperature sensor 14 and control circuit 13 in close thermal contact with the outside of the wall of oven 11. Control circuit 13 is responsive to information from temperature sensor 14 to control the temperature of outer oven 11 based on information previously stored in control circuit 13.

Outer oven 11 with its associated circuitry (described in the previous paragraph), and inner oven 15 with its associated circuitry, are all contained inside an insulated, hermetically sealed, oscillator case 32.

The prior art addresses only temperature stability in inner ovens and outer ovens of a DOCXO to achieve oscillator stability. The present invention utilizes such temperature stability and, in accordance with the teaching of the present invention, also addresses frequency instabilities in a DOCXO caused by pressure sensitivity of the components of the oscillator.

Ambient pressure changes are known to affect the frequency of crystal resonators. Pressure changes induce small physical deformations of the walls and components of the inner and outer ovens of a DOCXO. The deformation of the inner oven wall alters the stray capacitance between the oscillator components and the wall of the inner oven. In addition, these pressure changes induce small stresses in the mounting assembly of the crystal resonator thereby causing frequency change. Even when the DOCXO oscillator case is hermetically sealed, and the inner and outer ovens are hermetically sealed and temperature controlled, the temperature inside both the oscillator case and the outer oven will vary a little following ambient temperature changes outside the oscillator case. Temperature changes in the gas or air inside the oscillator case and the outer oven of the DOCXO will also induce pressure changes therein according to well-known laws of the gas behavior including Boyle's law. These temperature caused pressure changes cause minute deformations of the inner oven case wall and the outer oven case wall. Even if the temperature control is maintained to an extremely high degree of precision, such as 100 milledegrees, the pressure effects described above can induce frequency shifts exceeding design specifications.

Stated another way, changes in pressure inside the oscillator case 32 due to ambient pressure and temperature changes cause minute deformations of the case wall of the outer oven 11 and the inner oven 15. These minute deformations affect the frequency of oscillation of the oscillator by varying stray capacitance between the oscillator components and the case wall of the oven, and by inducing pressure related stresses and deformations of the wall of inner oven 15 and crystal 17 and other oscillator circuit components inside inner oven 15. Keeping the interior temperature constant of inner oven 15 isolates to a degree the environment of inner oven 15 from the environment inside outer oven 11 and oscillator case 32, and the ambient environment external to oscillator case 32. This helps to maintain a constant pressure, as well as a constant temperature inside inner oven 15 but there are still small pressure changes that will affect the stability of the oscillator. In addition, keeping the interior temperature constant, evacuating, and hermetically sealing outer oven 11 isolates to a degree the environment inside outer oven 11 from both the temperature and pressure conditions within the oscillator case 32 and ambient temperature and pressure conditions external to oscillator case 32. These steps can only reduce pressure changes inside inner oven 15 that can affect the oscillator crystal 17 to change its frequency of oscillation, but there are demands for even greater oscillator stability that cannot be met by these steps.

Any remaining pressure changes that occur inside outer oven 11 will induce physical deformation in the wall of inner oven 15. Such deformation will change the pressure inside inner oven 15 and thereby affect the frequency of oscillation of crystal 17. This deformation induced stress in crystal 17 and other oscillator components affect the frequency of oscillation.

In addition, there is stray capacitance between components of oscillator circuitry 16 and the wall of outer oven 11. Any pressure variations on the wall of outer oven 11 cause mechanical deformations of the oven wall and thereby changes the stray capacitances which will change the frequency of operation of the oscillator. Since pressure changes on the case wall of outer oven 11 cannot be completely eliminated, the stray capacitance must be minimized. In accordance with the teaching of the invention a Faraday shield 21 at ground potential is placed over oscillator circuit 16, between oscillator circuit 16 and case wall of outer oven 11. This minimizes any frequency instabilities caused by the stray capacitance. Other steps to minimize the effects of pressure changes are to hermetically seal the case of outer oven 11 and the case of outer oscillator case 32. Further, the interior of outer oven 11 and the outer oscillator case 32 may be evacuated.

In addition, control leads and oscillator output leads from both inner oven 15 and outer oven 11 do not pass directly to the outside of oscillator case 32. This minimizes any heat flow along these leads. Further, components inside outer oven 11 associated with inner oven 15 are located to be in good thermal contact with a heat spreader 25 and heater 18 of inner oven 15. Further, components inside oscillator case 32 that are associated with outer oven 11 are located to be in good thermal contact with the wall of outer oven 11. The end result is a relatively small and inexpensive DOCXO oscillator providing an accuracy in the order of 0.02 to 0.05 ppb per 100° Centigrade which is orders of magnitude better than comparable prior art oscillators. This is an accuracy that is comparable to some prior art rubidium clocks which are more costly.

DESCRIPTION OF THE DRAWING

The invention will be better understood upon reading the following Detailed Description in conjunction with the drawing in which.

DETAILED DESCRIPTION

Figure 1:
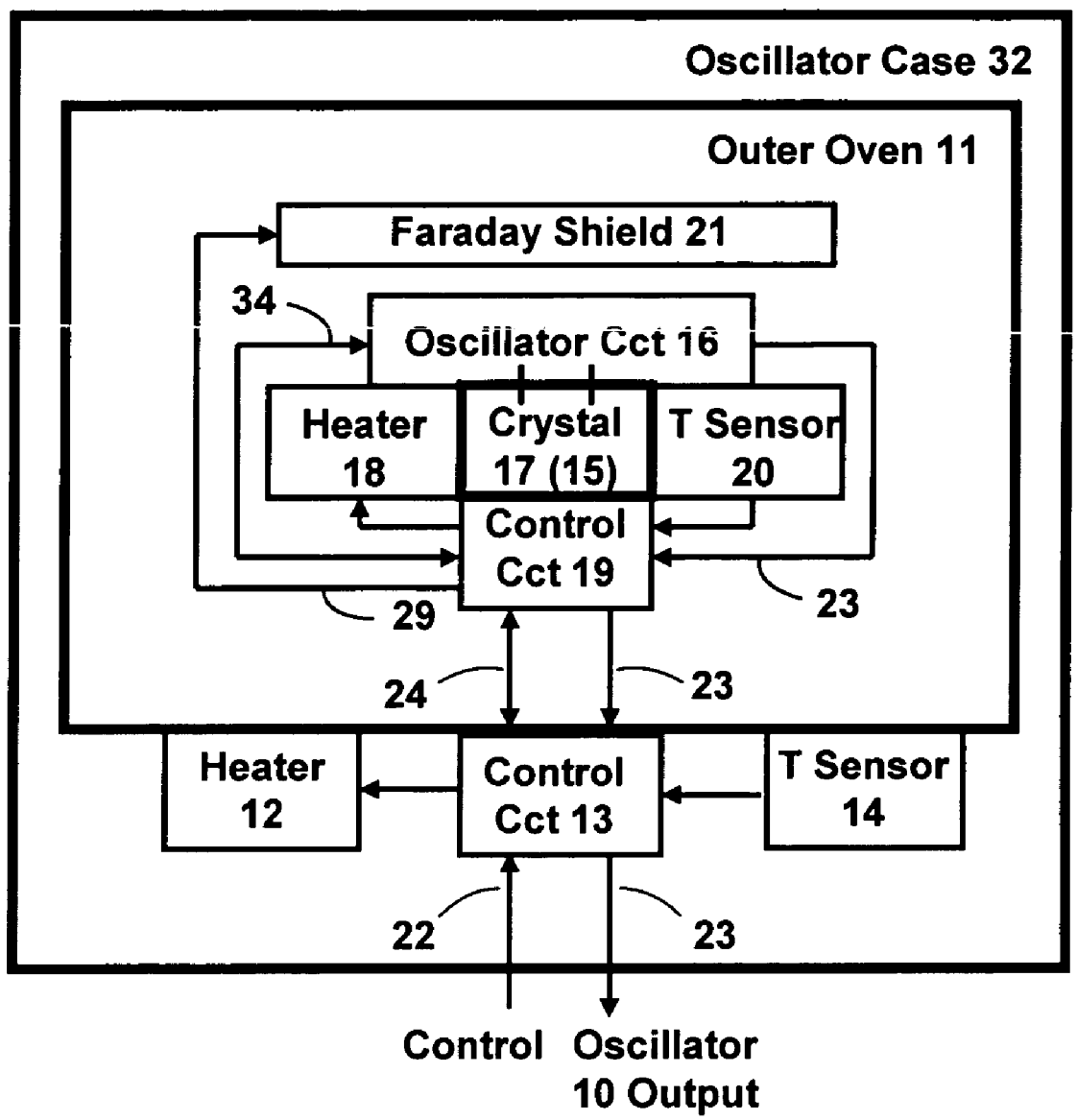
FIG. 1 is a block diagram drawing showing the configuration of the elements of the oscillator of the present invention and how they are organized inside nested, temperature controlled and hermetically sealed cases to control the temperature, pressure and stray capacitances on an oscillator crystal and its associated circuitry.

The following description is to teach a person skilled in the art to make and use the invention. Various modifications to the preferred embodiment disclosed herein will be readily apparent to those skilled in the art, and the general principles defined herein may be applied to other embodiments and applications without departing from the spirit and scope of the invention. Thus, the present invention is not intended to be limited to the embodiment disclosed herein, but is to be accorded the widest scope consistent with the principles and features disclosed herein.

The need in the art for a highly stable, double oven controlled crystal oscillator (DOCXO) is satisfied by the present invention which provides a novel DOCXO oscillator 10 having an accuracy in the order of 0.02 to 0.05 ppb (parts per billion) per 100° Centigrade. This is significantly more stable than the 0.5 to 2.0 ppb per 100° Centigrade accuracy of comparable prior art DOCXO oscillators. The novel DOCXO oscillator 10 utilizes temperature control as in the prior art, but also introduces pressure control inside the case and ovens of the DOCXO. The control of pressure effects greatly minimizes frequency changes of the oscillator caused by ambient pressure changes around oscillator 10.

Ambient pressure changes induce small physical deformations inside DOCXO oscillator 10. Pressure caused deformations in the wall of the oscillator case 32 change the pressure inside case 32 which induces small physical deformations in the wall of temperature controlled outer oven 11. The deformations in the wall of the outer oven 11 change the pressure inside oven 11 which induces small physical deformations in the wall of temperature controlled inner oven 15. The deformations in the wall of outer oven 11 alter stray capacitance between oscillator circuit 16 and the wall of outer oven 11. In addition, these deformations induce stress in the mounting assembly of the crystal 17 and components of oscillator circuit 16 and thereby induce frequency change. Even if the wall of oscillator case 32 and the wall of outer oven 11 are hermetically sealed and evacuated, the internal pressure will vary a small amount with ambient pressure changes. These small pressure changes cause deformations that induce stress in crystal 17 and components of oscillator circuit 16 and thereby affect the frequency of operation.

Ambient temperature changes also induce small physical deformations inside DOCXO oscillator 10. Ambient temperature changes alter the temperature inside oscillator case 32. Insulation minimizes but cannot eliminate this change. The temperature changes inside oscillator case 32 will induce pressure changes on the wall of outer oven 11 according to well known laws of gas behavior that will deform the wall of outer oven 11. Temperature control of outer oven 11 will minimize, but not eliminate, these pressure changes inside outer oven 11. The mechanical deformation of the case wall of the outer oven 11 changes the pressure inside outer oven 11. This pressure change cannot be eliminated by the temperature control of inner oven 15. The mechanical deformation of the case wall of the outer oven 11 modulates stray capacitances that exist between the wall of outside oven 11 and oscillator circuit 16 and will change the frequency of operation of oscillator 10. In addition, the deformation causes small stresses in crystal 17 and components of oscillator circuit 16 that will also change the frequency of operation of oscillator 10.

Since the effect of ambient pressure changes inside oscillator case 32 and external to the case wall of outer oven 11 of the DOCXO oscillator 10 can be minimized but not completely eliminated, to help minimize the above described ambient pressure effects the interior of the inner oven 15 and the outer oven 11 of the DOCXO oscillator 10 may be evacuated. This helps minimize but not eliminate changes in frequency caused by pressure changes. However, if a gas exists internal to the inner oven, it must be a mono population. When there is a mixture of two or more gasses they will migrate to colder places and change the statistical densities relative to ambient temperature. This has the possibility to change the frequency by changing the dielectric constant of the gasses inside the inner oven, and thus interacting with the electric fields around the sensitive frequency determining networks. These effects have been observed, and typically have very long time constants on the order on many hours. In short measurement intervals they appear as a hysterisis. In addition, without a reasonable outer oven control, gradients in the gas surrounding the inner oven will change or redistribute themselves depending on the physical orientation on the assembly. This is problematic in situations where the orientation might change in use, such as aeronautical or shipboard environments. In such applications it is required that the inner oven be evacuated, or special potting compounds must be used therein to render the gas inside the inner oven immobile.

However, the affect of the stray capacitance between the wall of outer oven 11 and oscillator circuit 16 may be minimized. This is done by placing a Faraday shield 21 at ground potential over the oscillator circuitry 16, between the circuitry of oscillator circuit 16 and the inner surface of the case wall of outer oven 11. This minimizes any frequency instabilities caused by variations in the stray capacitance caused by ambient pressure changes.

In addition, to further stabilize the frequency of oscillation of oscillator 10 no leads connected to inner oven 15 and the components associated therewith pass directly through the wall of outer oven 11 and the wall of oscillator case 32 to external to the DOCXO oscillator 10. That little thermal conductivity occurs along such leads and interferes with the thermal stability of the inner oven and the components associated therewith.

FIG. 1 shows a simplified block diagram of DOCXO oscillator 10, and understanding FIG. 1 aids in subsequently understanding of FIG. 2. DOCXO oscillator 10 comprises a hermetically sealed and evacuated oscillator case 32 inside of which are the nested inner oven 15 and outer oven 11. Outer oven 11 is also evacuated and hermetically sealed. Such evacuation and sealing helps to minimize the effects of temperature and pressure changes on the frequency stability of oscillator 10. Within oscillator case 32, and external to wall of outer oven 11 are located heater 12, temperature sensor 14 and control circuit 13. These components 12, 13 and 14 are mounted against the outside wall of outer oven 11 in good thermal contact therewith for heating, sensing and controlling the temperature of outer oven 11. Control circuit 13 receives control signals on control leads 22 from external to DOCXO oscillator 10 indicating the temperature at which outer oven 11 and inner oven 15 are to be maintained. Alternatively, this control information may be permanently stored in a memory that is part of each of the control circuits 13 and 19. Temperature information received from temperature sensor 14 is compared to the control signals for outer oven 11 and, responsive thereto, power is applied or not applied to heater 12 to heat outer oven 11 and keep it at a predefined temperature. Although not shown in FIG. 1 there is a heat spreader over the wall of outer oven 11 to ensure that it is heated evenly by heater 12 and hot spots are minimized or eliminated. This is described in greater detail with reference to FIG. 2. Control signals for inner oven 15 pass through outer oven control circuit 13 to inner oven control circuit 19.

Included with control input leads 22 is a lead having electrical ground potential thereon which is connected to control circuit 13 and is needed along with power for the operation of circuits 12, 13 and 14. From there the ground is connected via one of control leads 24 to control circuit 19 and is needed along with power for the operation of circuits 16, 18, 19 and 20. In addition, the ground is passed via lead 29 to Faraday shield 21. It is important to note that the electrical ground applied via lead 29 to Faraday shield 21 and the output from oscillator circuit 16 on lead 23 do not connect directly to the outside of DOCXO oscillator 10 but, rather, connect via both control circuit 19 and control circuit 13 to the outside of oscillator 10. This is done to further isolate oscillator circuit 16 and crystal 17, and the components of outer oven 11 from ambient temperature changes. There is less thermal flow along leads that are interrupted.

The temperature inside outer oven 11 is held constant by control circuit 13, heater 12 and temperature sensor 14 in a manner well known in the prior art. Components 12, 13 and 14 are mounted against the wall of outer oven 11 to be in good thermal contact therewith. Temperature sensor 14 provides an output signal to control circuit 13 indicating the temperature inside outer oven 11. Control circuit 13 is processor controlled in a manner known in the art and compares the signal from sensor 14 with a stored value indicating the desired temperature inside outer oven 11. If it is determined by control circuit 13 that the temperature inside outer oven 11 is below a predetermined temperature more electrical power is applied to heater 12 which adds thermal energy to the inside of outer oven 11, and visa versa. In this manner the temperature inside outer oven 11 is held very closely to the predetermined temperature.

As previously described inner oven 15 contains only oscillator crystal 17. Although not shown in FIG. 1 there is a heat spreader over the wall of inner oven 15 (crystal 17) to ensure that it is heated evenly by heater 18 and hot spots are minimized or eliminated. Heater 18 is mounted around the heat spreader. This is described in greater detail with reference to FIG. 2. Oscillator circuit 16 and control circuit 19 are mounted adjacent to heat spreader and heater 18 to be in close thermal contact. This physical arrangement facilitates good temperature control of the components. Temperature sensor 20, mounted with control circuit 19, provides an output signal to control circuit 19 indicating the temperature of crystal 17 inside inner oven 15. Control circuit 13 is processor controlled in a manner well known in the art and compares the signal from temperature sensor 20 with a stored value indicating a predetermined desired temperature of crystal 17. If it is determined by control circuit 19 that the temperature of crystal 17 is below the predetermined temperature more electrical power is applied to heater 18 which adds thermal energy to crystal 17 in inner oven 15, and visa versa. In this manner the temperature of crystal 17 is held very close to the predetermined temperature.

As previously described, ambient pressure changes and temperature changes external to the wall of oscillator case 32 of DOCXO oscillator 10 cause pressure changes inside case 32 that will induce small mechanical deformations in the wall of outer oven 11. These mechanical deformations, though small, affect the frequency of oscillation of crystal 17 and oscillator circuit 16 by inducing pressure related stresses and deformations of the package of crystal 17 and of other components that are part of oscillator circuit 16.

In addition, these small deformations of the case wall of outer oven 11 vary the stray capacitance between the case wall and oscillator circuit 16. The stray capacitance varies the frequency of the oscillations output from oscillator circuit 16. Thus, the stray capacitance must be minimized or eliminated. This is done in accordance with the teaching of the present invention by placing a Faraday shield 21 at ground potential between oscillator circuitry 16 and the wall of outer oven 11.

Control circuit 13 is preferably an analog circuit that receives control signals in analog format on input control leads 22. Signals input to control circuit 13 from temperature sensor 14 are also in analog form. Temperature sensor 14 may be a negative coefficient conventional thermistor. Heater 12 also requires and receives an analog power signal from control circuit 13. Alternatively, digital circuitry and D/A and A/D converters may be used.

Control circuit 19 is also preferably an analog circuit that receives control signals in analog format on its input control leads 24. These control signals originate on ones of the leads of control leads 22 and pass through control circuit 13 to help provide thermal isolation of outer oven 11 from external to oscillator case 32. Signals input to control circuit 19 from temperature sensor 20 are also in analog form. Temperature sensor 20 may also be a negative coefficient conventional thermistor. Heater 12 also requires and receives an analog signal from control circuit 13. Alternatively, digital circuitry and D/A and A/D converters may be used.

Leads that must pass through the wall of oscillator case 32 are sealed at the wall to maintain the hermetic seal and the evacuated state inside case 32. Such leads include representative control leads 22 and oscillator output lead 23. Included in leads 22 are power and ground leads, which are not shown separately, and include the electrical ground that is passed via control circuits 13 and 19 and lead 29 to Faraday shield 21. As previously described Faraday shield 21 minimizes stray capacitance between the wall of outer oven 11 and oscillator circuit 16 to help stabilize the frequency of oscillation.

Inner oven 15 surrounds crystal 17 and has a heat spreader 25 (not shown in FIG. 1) surrounding crystal 17 and heater 18 surrounds heat spreader 25. Crystal 17 is typically a quartz crystal composed of $SiO_2$. Crystal 17 is selected to have a "turning-point" at or near the temperature of inner oven 15 to further reduce its sensitivity to temperature changes. Another 10 degrees Celsius differential in temperature is then required between outer oven 11 and inner oven 15. Thus, the total heat rise between the temperature of crystal 17 and the temperature outside of outer oven 11 is more than 20 degrees Celsius.

The wall of oscillator case 32 is made of a relatively strong material having a low coefficient of thermal expansion to minimize the affects of ambient pressure changes on the pressure inside case 32. Case 32 is hermetically sealed and air may be evacuated there from. In addition the inside wall of oscillator case 32 may also have insulation thereon. These steps cooperate with control circuit 13, temperature sensor 14 and heater 12 to help stabilize the temperature inside oscillator case 32 somewhat. In order to maintain a constant temperature within oscillator 10, there must be a balance of power input to the oven with heat flowing out of oscillator 10.

When the case wall of outer oven 11 is physically strong and has a low coefficient of thermal expansion, the case wall is hermetically sealed and evacuated, and with the temperature control of outer oven 11, mechanical deformations to the outer oven case wall are minimized. In addition the case wall of outer oven 11 may have insulation thereon.

The combination of the above described measures minimize changes to crystal 17 and oscillator circuit 16 caused by changes in pressure inside outer oven 11. The measures also allow the temperature of inner oven 15 to be more precisely matched to the turnover (turning point) temperature of crystal 17. This results in an improvement in frequency stability of oscillator 10 of more than one order of magnitude over prior art oscillators.

While the above described combination of measures can produce oscillator stability in the order of a milliHz for a 10 MHz signal, ones of the measures may be eliminated to achieve improved oscillator stability but less than maximum stability will be achieved. For example, one or both of the oscillator case 32 and/or outer oven 11 need not be evacuated or hermetically sealed. However, the high insulation properties of a vacuum may permit reductions in the size of the outer oven 11 and/or the oscillator case 32 without affecting the overall improvement in oscillator stability.

Figure 2:
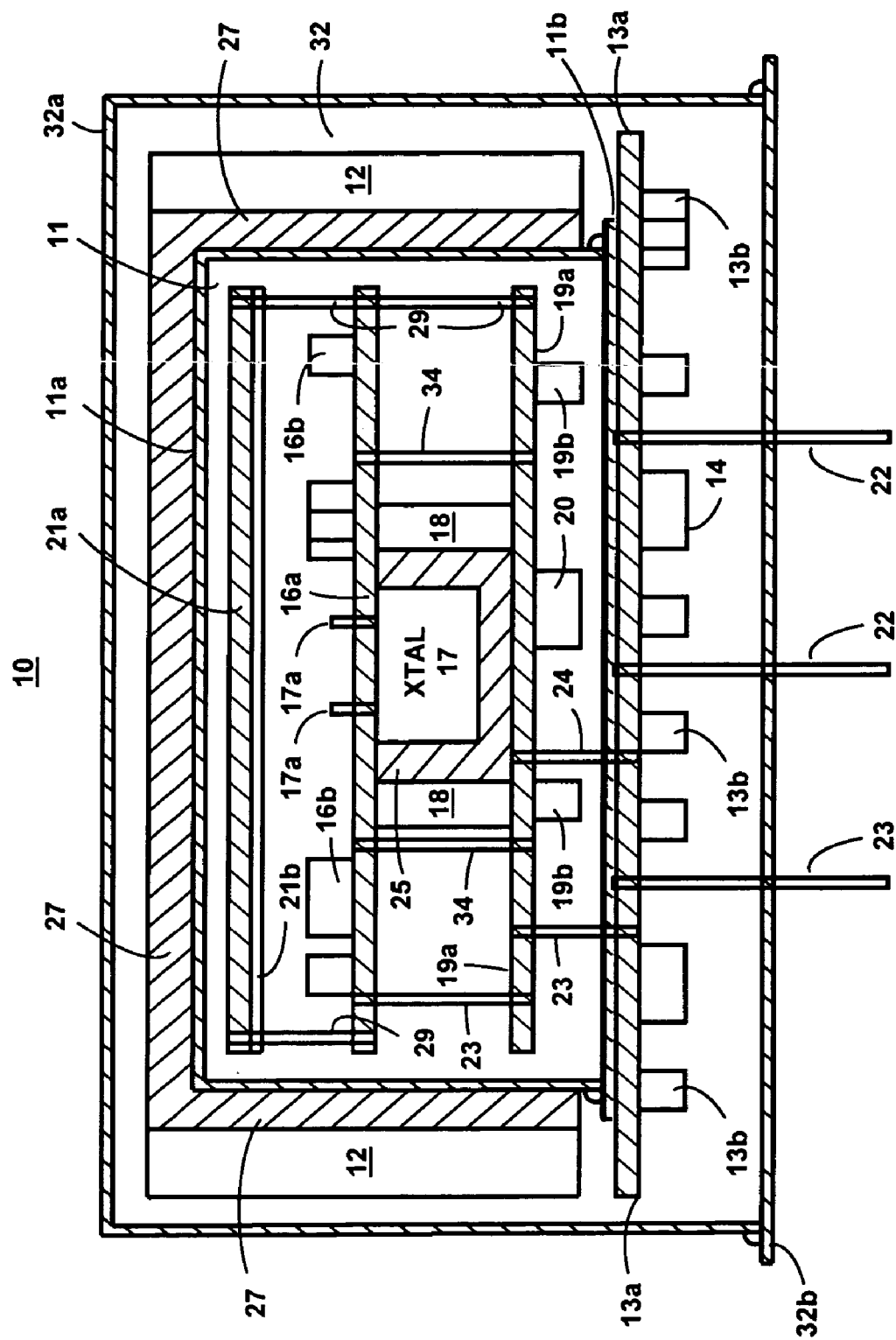
FIG. 2 is a side, cutaway view of the novel DOCXO oscillator showing the structure and orientation of the elements inside the oscillator.

FIG. 2 is a side, cutaway view of the novel DOCXO oscillator 10 that shows detail of the structure and the orientation of the elements inside oscillator 10. Starting at the outside of oscillator 10 there is oscillator case 32 comprising a top 32a and a base 32b. Inside case 32 is outer oven 11 with inner oven 15 therein. There is also control circuit 13, heat spreader 27, heater 12 and temperature sensor 14. Control circuit 13 is assembled on a circuit board 13a with representative control components 13b as shown. Mounted on circuit board 13a is also temperature senor 14. It can be seen that circuit board 13a is physically mounted to be touching bottom 11b of outer oven 11 to be in good thermal contact therewith. Heat spreader 27 covers and touches top 11a and heater 12 surrounds spreader 27. Although not shown, heater 12 is connected to the control circuitry 13 on circuit board 13a.

Extending through the bottom case wall 32b of oscillator case 32 are all control, power and output leads for DOCXO oscillator 10. Control and power leads 22 and oscillator 10 output lead 23 pass through holes through the bottom 32b of oscillator case 32 and the holes are sealed. In FIG. 2 only three representative ones of such leads are shown to avoid cluttering up the drawing. Shown are two leads 22 which correspond to the control input leads 22 in FIG. 1. Although not specifically shown in FIG. 1 or FIG. 2, electrical power and ground leads are included amongst leads 22. Top 32a of oscillator case 32 is sealed to bottom 32b.

In FIG. 1 lead 29 with ground potential thereon is connected to Faraday shield 21. Lead 29 is also connected to oscillator circuit board 16a. The ground is combined in control leads 24 to and from outer control circuit board 13a, and thence to control leads 22 extending from DOCXO oscillator 10 where ground potential is input to oscillator 10. In FIG. 2 lead 29 goes from a metallic layer 21b on Faraday shield circuit board 21 to oscillator circuit board 16a and thence to inner oven control circuit board 19a. At this point the ground lead is shown combined with leads 24 to outer oven control circuit board 11b and thence to leads 22 extending from the bottom of oscillator case 32.

Outer oven 11 has control, power and ground leads 24 and oscillator output lead 23 extending through its base 11b and these leads are connected to circuit board 13a of control circuit 13. As shown in FIG. 2 circuit board 13a is oriented so that it touches outer oven base 11b to be in good thermal contact therewith.

In FIG. 1 the signal output from oscillator circuit 16 is on lead 23 which passes through control circuit 19 and control circuit 13 to exit DOCXO oscillator 10 on lead 23 as "Oscillator 10 Output". In FIG. 2 the path of lead 23 is as follows. Lead 23 exits circuit board 16a of oscillator circuit 16 and is connected to circuit board 19a of control circuit 19 within inner oven 15. Inner oven 15 is surrounded by its case walls 15a and 15b. The oscillator signal travels through a portion of circuit board 19a to another lead 23 which passes through lower wall 15b of outer oven 11. This last mentioned lead 23 is insulated from lower case wall 11b and the exit point is hermetically sealed. The lead 23 exiting outer oven 11 at lower case wall 11b is electrically connected to circuit board 13a of control circuit 13. The oscillator signal travels through a small portion of circuit board 13a to another lead 23 which passes through lower wall 32b of oscillator case 32. This last mentioned lead 23 is insulated from lower case wall 32b and the exit point is hermetically sealed.

More particularly, the control, power and ground leads 24 and oscillator output lead 23 described in the previous paragraphs extend through lower case wall 11b of outer oven 11 and are connected to circuit board 13a of control circuit 13. Circuit board 13a touches lower case wall 11b to be in good thermal contact therewith. On the bottom surface of circuit board 13a are mounted a plurality of electrical components 13b that make up control circuit 13 of outer oven 11. Only a few of such components 13b are shown to avoid cluttering the drawing. Such control circuits are well known the art. Also mounted on the bottom surface of circuit board 13a of control circuit 13 is temperature sensor 14 which is used to monitor the temperature inside outer oven 11. Responsive to signals from temperature sensor 14 control circuit 13 will control the amount of power applied to heater 12 to maintain the temperature inside outer oven 11 at a predetermined temperature as previously described with reference to FIG. 1.

Outer oven 11 is mounted on top of control circuit board 13a. Surrounding outer oven 11 is a heat spreader 27 that is well known in the art. Mounted on the outside of heat spreader 27 is heater 12. Heat spreader 28 assures that heat generated by heater 12 is uniformly spread around the outer case 11a of outer oven 11.

Inside outer oven 11 the components are mounted as follows. Control circuit 19 has a circuit board 19a on which are mounted the components that make up circuit 19. In FIG. 2 these components are designated 19b and are mounted on the underside of board 19a as shown in this figure. Circuit board 19a touches heat spreader 25 of inner oven 15 to be in good thermal contact therewith. Only a few representative components 19b are shown in FIG. 2 to avoid cluttering the drawing and because such control circuits are well known in the art.

Also mounted on the bottom surface of circuit board 19a of control circuit 19 is temperature sensor 20 which is used to monitor the temperature of inner oven 15 as previously described with reference to FIG. 1. Responsive to signals from temperature sensor 20 control circuit 10 will control the amount of power applied to heater 18 to maintain the temperature inside inner oven 15 at a predetermined temperature. The temperature has been previously described with reference to FIG. 1.

Heater 18 is not mounted on circuit board 19a. Instead it is mounted around crystal 17 which is mounted on circuit board 16a of oscillator circuit 16. Such heaters for use in oscillators are well known in the art. Surrounding crystal 17 is a heat spreader 25 that is well known in the art. Mounted on the outside of heat spreader 25 is heater 18. Heat spreader 25 assures that heat generated by heater 18 is uniformly spread around the case of crystal 17.

Oscillator circuit 16 has crystal 17 mounted to the underside of its circuit board 16a as described the previous paragraph. Mounted on the top side of circuit board 16a are other components 16b which make up oscillator circuit 16. Such oscillator circuits are well known in the art and are not described in further detail herein. Signals from control circuit 19 to control oscillator 16 are sent via leads 34 from circuit board 19 to oscillator circuit board 16a. Two such leads 26 are shown in FIG. 2.

As previously described stray capacitance between the components 16b and their interconnections on circuit board 16a, and the circuit paths on board 16a, and case wall 11a vary as pressure changes occur inside oscillator case 32 and create deformations in case wall 11a. The varying stray capacitance detrimentally change the frequency output from oscillator circuit 16. These changes are very small but they detrimentally affect the frequency of the signal output from oscillator 10. In accordance with the teaching of the invention, by placing a grounded Faraday shield 21 between circuit board 16a with components 16b and case wall 11a, the effects of the stray capacitance is effectively minimized and the stability of DOCXO 10 is increased. Shield 21 comprises a circuit board 21a covered with a conductive layer 21b that is connected to electrical ground by leads 29. The dimensions of shield 21 are such that it completely covers circuit board 16a. While shield 21 is shown flat in FIG. 2, alternatively it could be enlarged and have sides added to form a box shape that will cover the edges of circuit board 16a. This would reduce stray capacitance even more.

While what has been described hereinabove is a preferred embodiment of the invention it will be understood by those skilled in the art that numerous changes may be made without departing from the spirit and scope of the invention.

The invention claimed is:

1. An ovenized oscillator assembly that has reduced sensitivity to ambient pressure changes external to the oscillator assembly, comprising:
   a) a first temperature controlled oven;
   b) a crystal that is mounted in the first temperature controlled oven;
   c) a first substrate having a first and a second side; the first temperature controlled oven with the crystal mounted therein being mounted on the first side of the first substrate;
   d) an oscillator circuit mounted on the second side of the first substrate and being in close thermal contact with the first temperature controlled oven, the oscillator circuit being operable to produce a reference frequency;

e) a first control circuit for controlling the operation of both the temperature of the first temperature controlled oven and the frequency of operation of the oscillator circuit, the first control circuit being mounted against the first temperature controlled oven to be in close thermal contact with the first temperature controlled oven;

f) a Faraday shield mounted close to the oscillator circuit;

g) a second temperature controlled oven comprising a first case in which are mounted the first temperature controlled oven with the crystal therein, the first substrate with oscillator circuit and first control circuit mounted thereon, and the Faraday shield, the first case having a first wall and the Faraday shield is positioned between the first wall and the oscillator circuit to shield the oscillator circuit from varying stray capacitance caused by the first wall being deformed by pressure changes inside the ovenized oscillator;

h) a second substrate, the second substrate having a first side and a second side, the case of the second temperature controlled oven being mounted on the first side of the second substrate;

i) a second control circuit for controlling the temperature of the second temperature controlled oven, the second control circuit being mounted on the second side of the second substrate to be in close thermal contact with the second temperature controlled oven; and j) an oscillator case in which are mounted the second substrate with the second temperature controlled oven and the second control circuit thereon.

2. The ovenized oscillator assembly of claim 1 further comprising a first heater adjacent to the first temperature controlled oven, the temperature of the first heater being controlled by the first control circuit to thereby control the temperature inside the first temperature controlled oven.

3. The ovenized oscillator assembly of claim 2 wherein the case of the second temperature controlled oven has an inner side and an outer side and further comprising a second heater adjacent to the outer side of the wall of the second temperature controlled oven, the temperature of the second heater being controlled by the second control circuit to thereby control the temperature inside the second temperature controlled oven.

4. The ovenized oscillator assembly of claim 3 further comprising a first temperature sensor being mounted in close proximity to the first temperature controlled oven to sense the temperature inside the first temperature controlled oven, the first control circuit being responsive to the first temperature sensor for controlling the temperature of the first heater.

5. The ovenized oscillator assembly of claim 4 further comprising a second temperature sensor being mounted in close proximity to the second temperature controlled oven to sense the temperature inside the second temperature controlled oven, the second control circuit being responsive to the second temperature sensor for controlling the temperature of the second heater.

6. The ovenized oscillator assembly of claim 1 wherein the reference frequency produced by the oscillator circuit is output there from via a first lead that is not connected directly to the exterior of the oscillator case, but is output via an interrupted path through the first substrate and the second substrate to hinder thermal energy flowing from the second temperature controlled oven.

7. The ovenized oscillator assembly of claim 6 wherein the first case of the second temperature controlled oven is hermetically sealed.

8. The ovenized oscillator assembly of claim 6 wherein the oscillator case is hermetically sealed.

9. The ovenized oscillator assembly of claim 6 wherein the first case of the second temperature controlled oven and the oscillator case are evacuated of gas.

10. An ovenized oscillator assembly, comprising:

a) a first temperature controlled oven;

b) a crystal that is mounted in the first temperature controlled oven;

c) a first substrate; the first temperature controlled oven with the crystal mounted therein being mounted on the first substrate;

d) an oscillator circuit mounted on the first substrate and being in close thermal contact with the first temperature controlled oven, the oscillator circuit being operable to produce a reference frequency;

e) a first control circuit for controlling the operation of the temperature of the first temperature controlled oven, the first control circuit being mounted against the first temperature controlled oven to be in close thermal contact therewith;

f) a Faraday shield mounted close to the oscillator circuit;

g) a second temperature controlled oven comprising a first case in which are mounted the first temperature controlled oven with the crystal therein, the first substrate with oscillator circuit and first control circuit mounted thereon, and the Faraday shield, the first case having a first wall and the Faraday shield is positioned between the first wall and the oscillator circuit to shield the oscillator circuit from stray capacitance caused by the first wall;

h) a second substrate, the second substrate having the case of the second temperature controlled oven being mounted thereon;

i) a second control circuit for controlling the temperature of the second temperature controlled oven, the second control circuit being mounted on the second substrate to be in close thermal contact with the second temperature controlled oven; and j) an oscillator case in which are mounted the second substrate with the second temperature controlled oven and the second control circuit thereon.

11. The ovenized oscillator assembly of claim 10 wherein the reference frequency produced by the oscillator circuit is output there from via a first lead that is not connected directly to the exterior of the oscillator case, but is output via an interrupted path through the first substrate and the second substrate to hinder thermal energy escaping from the second temperature controlled oven.

12. The ovenized oscillator assembly of claim 11 further comprising a first temperature sensor being mounted in close proximity to the first temperature controlled oven to sense the temperature therein, the first control circuit being responsive to the first temperature sensor for controlling the temperature of the first heater.

13. The ovenized oscillator assembly of claim 12 further comprising a second temperature sensor being mounted in close proximity with the second temperature controlled oven to sense the temperature inside the second temperature controlled oven, the second control circuit being responsive to the second temperature sensor for controlling the temperature of the second heater.

14. The ovenized oscillator assembly of claim 13 further comprising a first heater adjacent to the first temperature controlled oven, the temperature of the first heater being controlled by the first control circuit to thereby control the temperature inside the first temperature controlled oven.

15. The ovenized oscillator assembly of claim 14 wherein the case of the second temperature controlled oven has an inner side and an outer side and further comprising a second heater adjacent to the outer side of the wall of the second temperature controlled oven, the temperature of the second heater being controlled by the second control circuit to thereby control the temperature inside the second temperature controlled oven.

16. The ovenized oscillator assembly of claim 15 wherein the first case of the second temperature controlled oven is hermetically sealed.

17. The ovenized oscillator assembly of claim 16 wherein the oscillator case is hermetically sealed.

18. The ovenized oscillator assembly of claim 17 wherein the first case of the second temperature controlled oven and the oscillator case are evacuated of gas.

19. An ovenized oscillator assembly that has reduced sensitivity to ambient pressure changes external to the oscillator assembly, comprising:
 a) a first temperature controlled oven;
 b) a crystal that is mounted in the first temperature controlled oven;
 c) an oscillator circuit cooperating with the crystal to produce a reference frequency;
 d) a Faraday shield mounted close to the oscillator circuit;
 e) a second temperature controlled oven comprising a first case in which are mounted the first temperature controlled oven with the crystal therein, the oscillator circuit and the Faraday shield, the first case having a first wall and the Faraday shield is positioned between the first wall and the oscillator circuit to shield the oscillator circuit from varying stray capacitance caused by the first wall being deformed by pressure changes inside the ovenized oscillator; and
 f) an oscillator case in which is mounted the second temperature controlled oven.

20. The ovenized oscillator assembly of claim 19 wherein the Faraday shield is maintained at ground potential.

* * * * *